(12) United States Patent
Vincent et al.

(10) Patent No.: US 12,381,164 B2
(45) Date of Patent: Aug. 5, 2025

(54) SEMICONDUCTOR DEVICE WITH ENCLOSED CAVITY AND METHOD THEREFOR

(71) Applicant: NXP USA, INC., Austin, TX (US)

(72) Inventors: Michael B. Vincent, Chandler, AZ (US); Scott M. Hayes, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 656 days.

(21) Appl. No.: 17/805,955

(22) Filed: Jun. 8, 2022

(65) Prior Publication Data

US 2023/0402408 A1    Dec. 14, 2023

(51) Int. Cl.

| | |
|---|---|
| H01L 23/66 | (2006.01) |
| H01L 21/48 | (2006.01) |
| H01L 21/56 | (2006.01) |
| H01L 21/683 | (2006.01) |
| H01L 23/00 | (2006.01) |
| H01L 23/31 | (2006.01) |
| H01L 23/538 | (2006.01) |
| H01L 23/552 | (2006.01) |
| H01Q 15/14 | (2006.01) |

(52) U.S. Cl.
CPC .......... *H01L 23/66* (2013.01); *H01L 21/4853* (2013.01); *H01L 21/565* (2013.01); *H01L 21/568* (2013.01); *H01L 21/6835* (2013.01); *H01L 23/3128* (2013.01); *H01L 23/5386* (2013.01); *H01L 23/552* (2013.01); *H01L 24/19* (2013.01); *H01L 24/20* (2013.01); *H01Q 15/14* (2013.01); *H01L 2221/68359* (2013.01); *H01L 2223/6677* (2013.01); *H01L 2224/214* (2013.01)

(58) Field of Classification Search
CPC .............. H01L 21/568; H01L 21/6835; H01L 2221/68359; H01L 23/66; H01P 11/00
See application file for complete search history.

(56) References Cited

U.S. PATENT DOCUMENTS

| | | | |
|---|---|---|---|
| 8,169,060 B2 | 5/2012 | Maurer et al. | |
| 9,136,230 B2 | 9/2015 | Demin et al. | |
| 10,992,022 B2* | 4/2021 | Khan | H01L 23/66 |
| 11,031,681 B2 | 6/2021 | Vincent et al. | |
| 11,196,146 B2* | 12/2021 | Moallem | G01S 7/032 |
| 11,777,204 B2* | 10/2023 | Carluccio | H01L 23/315 |
| | | | 343/700 R |
| 12,074,124 B2* | 8/2024 | Zanati | H01L 23/49811 |

(Continued)

*Primary Examiner* — Vincent Wall

(57) ABSTRACT

A method of forming a semiconductor device is provided. The method includes placing a semiconductor die and an RF sub-assembly on a carrier substrate. The RF sub-assembly includes a sacrificial blank, a conductive radiant element, and a conductive shield. At least a portion of the semiconductor die and the RF sub-assembly is encapsulated with an encapsulant. The carrier substrate is separated from the encapsulated semiconductor die and RF sub-assembly to expose a side of the sacrificial blank. The sacrificial blank is removed to form a cavity in the RF sub-assembly such that the conductive radiant element and the conductive shield are exposed through the cavity. A package lid is affixed on the encapsulated semiconductor die and RF sub-assembly and configured to serve as a signal reflector for propagation of an RF signal.

20 Claims, 23 Drawing Sheets

(56) References Cited

U.S. PATENT DOCUMENTS

| | | | |
|---|---|---|---|
| 12,243,842 B2 | 3/2025 | Vincent et al. | |
| 2007/0026567 A1* | 2/2007 | Beer | H01L 24/24 |
| | | | 257/E23.114 |
| 2015/0179589 A1* | 6/2015 | Takagi | H01L 23/66 |
| | | | 257/664 |
| 2015/0364830 A1* | 12/2015 | Tong | H10F 71/00 |
| | | | 342/27 |
| 2016/0218072 A1 | 7/2016 | Liao et al. | |
| 2017/0278808 A1* | 9/2017 | Liao | H01L 23/5227 |
| 2019/0089038 A1 | 3/2019 | Liao et al. | |
| 2019/0304934 A1 | 10/2019 | Kamphuis et al. | |
| 2019/0311998 A1* | 10/2019 | Ishibashi | H01L 23/5383 |
| 2020/0403298 A1* | 12/2020 | Vincent | H01L 23/66 |
| 2023/0268304 A1* | 8/2023 | Vincent | H01L 23/3185 |
| | | | 257/773 |
| 2023/0402408 A1* | 12/2023 | Vincent | H01L 23/552 |

\* cited by examiner

SEMICONDUCTOR DEVICE WITH ENCLOSED CAVITY AND METHOD THEREFOR

BACKGROUND

Field

This disclosure relates generally to semiconductor device packaging, and more specifically, to semiconductor devices with an enclosed cavity and method of forming the same.

Related Art

Today, there is an increasing trend to include sophisticated semiconductor devices in products and systems that are used every day. These sophisticated semiconductor devices may include features for specific applications which may impact the configuration of the semiconductor device packages, for example. For some features and applications, the configuration of the semiconductor device packages may be susceptible to lower reliability, lower performance, and higher product or system costs. Accordingly, significant challenges exist in accommodating these features and applications while minimizing the impact on semiconductor devices' reliability, performance, and costs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device with an enclosed resonant RF cavity. The semiconductor device includes a semiconductor die and a pre-formed RF sub-assembly at least partially encapsulated with an encapsulant while on a carrier substrate. The RF sub-assembly includes a sacrificial blank having a conductive radiant element formed on a first major side and a surrounding conductive shield formed partially on the first major side and on outer sidewalls. After encapsulation, portions of the radiant element, conductive shield, and conductive die connectors are exposed. The semiconductor die is interconnected with the radiant element by way of a package substrate and associated die connectors. After the carrier substrate is removed, a second major side of the sacrificial blank is exposed. The sacrificial blank is subsequently removed to form a cavity having the radiant element and surrounding shield exposed in the cavity. A conductive lid is attached to enclose the cavity, thus forming a resonant RF cavity. By forming the semiconductor device with the enclosed resonant RF cavity in this manner, low loss RF signal propagation can be realized.

Figure 1:
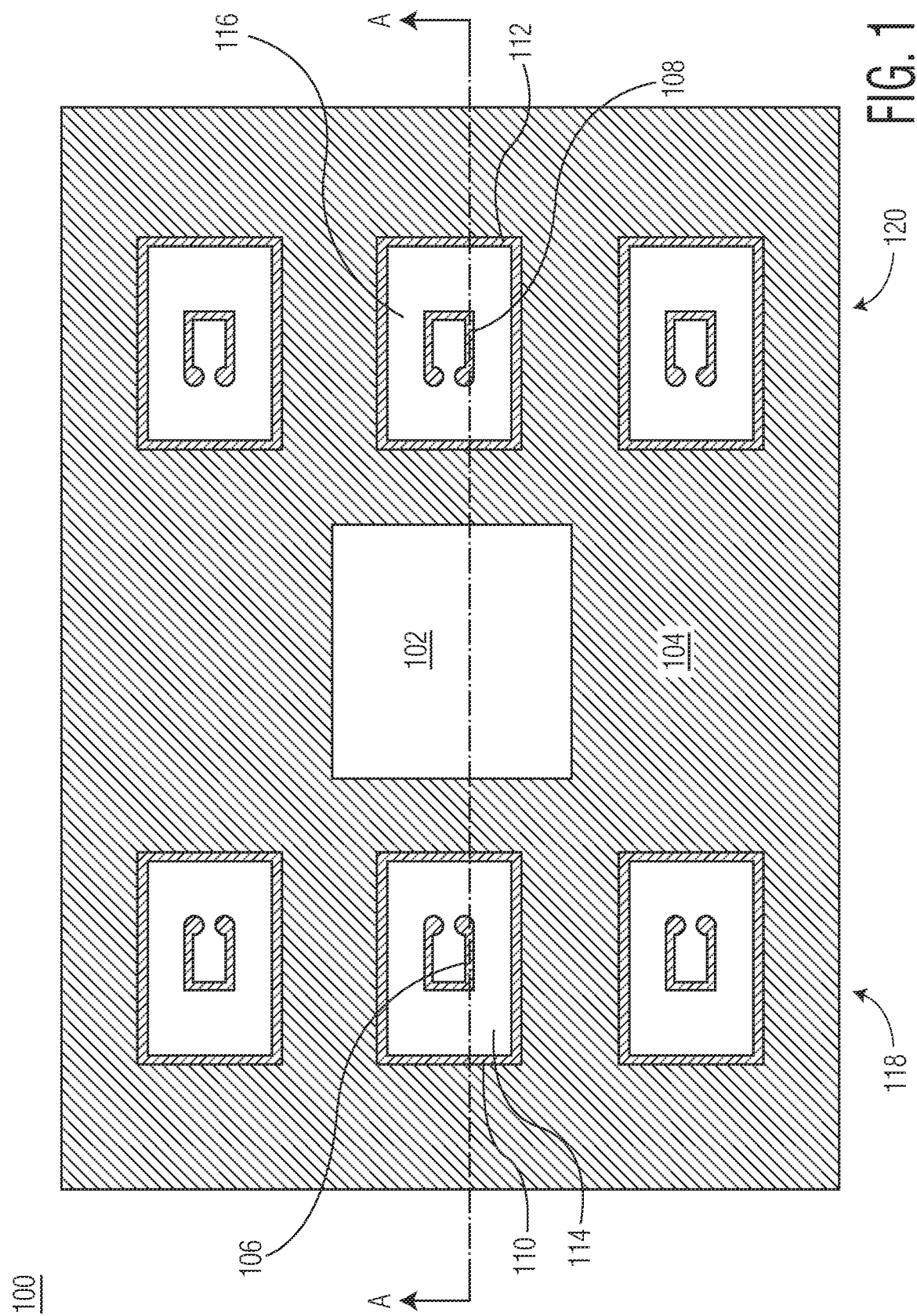
FIG. 1 illustrates, in a simplified top-side-up plan view, an example semiconductor device having a plurality of enclosed radio frequency (RF) cavities at a stage of manufacture in accordance with an embodiment.

FIG. 1 illustrates, in a simplified top-side-up plan view, an example semiconductor device 100 having a plurality of RF sub-assemblies at a stage of manufacture in accordance with an embodiment. At this stage of manufacture, the semiconductor device 100 includes a semiconductor die 102, a package substrate (not shown), and RF sub-assemblies 118 and 120 partially encapsulated with an encapsulant 104 (e.g., epoxy molding compound). In this embodiment, each of the RF sub-assemblies 118 and 120 include a conductive radiant element 106, 108 and surrounding conductive shield 110, 112 formed on a sacrificial blank (not shown). The term "conductive," as used herein, generally refers to electrical conductivity unless otherwise specified. A patterned dielectric material 114, 116 formed on the sacrificial blank electrically isolates the respective conductive radiant elements 106, 108 from surrounding conductive shields 110, 112. In this embodiment, the group of RF sub-assemblies 118 may be characterized as receiver (RX) sub-assemblies and the group of RF sub-assemblies 120 may be characterized as transmitter (TX) sub-assemblies. The size and shape of the RF sub-assemblies 118 and 120 along with the number and arrangement of the RF sub-assemblies 118 and 120 in this embodiment are chosen for illustration purposes. For example, the semiconductor device 100 may include any number of RF sub-assemblies 118 and 120, arranged accordingly. Simplified cross-sectional views of the example semiconductor device 100 taken along line A-A at stages of manufacture are depicted in FIG. 2 through FIG. 10.

Figure 2:
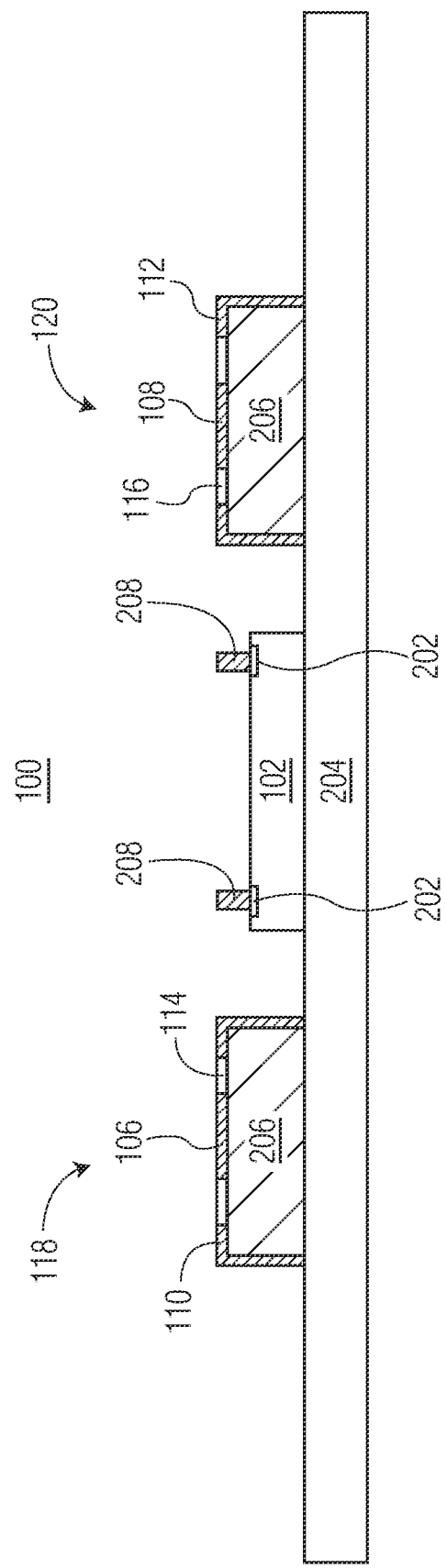
FIG. 2 through FIG. 10 illustrate, in simplified cross-sectional views, the example semiconductor device at stages of manufacture in accordance with an embodiment.

FIG. 2 illustrates, in a simplified bottom-side-up cross-sectional view, the example semiconductor device 100 taken along line A-A at a stage of manufacture in accordance with an embodiment. At this stage, the semiconductor device 100 includes the semiconductor die 102 and pre-formed RF sub-assemblies 118 and 120 placed on a carrier substrate 204. The carrier substrate 204 is configured and arranged to provide a temporary structure for placement of the semiconductor die 102 and the RF sub-assemblies 118 and 120 during encapsulation at a subsequent stage of manufacture, for example.

The semiconductor die 102 has an active side (e.g., major side having circuitry) and a backside (e.g., major side opposite of the active side). The semiconductor die 102 includes bond pads 202 formed at the active side. Bond pads 202 may be configured for connection to respective conductive radiant elements 106 and 108 of the RF sub-assemblies 118 and 120 by way of a package substrate formed at a subsequent stage, for example. In this embodiment, semiconductor die 102 is configured in an active-side-up orientation with the backside placed on the carrier substrate 204. The semiconductor die 102 may be formed from any suitable semiconductor material, such as silicon, germanium, gallium arsenide, gallium nitride, and the like. The semiconductor die 102 may further include any digital circuits, analog circuits, RF circuits, memory, processor, the like, and combinations thereof at the active side. In this embodiment, conductive die connectors 208 have a first end affixed to respective bond pads 202. The conductive die connectors 208 may be in the form of any suitable conductive structures such as gold studs, copper pillars, solder balls, and the like. Alternatively, the conductive die connectors 208 may be formed or affixed at a subsequent stage of manufacture. For example, after an encapsulation operation, the bond pads 202 may be exposed (e.g., by way of an etch, laser ablation, or other suitable process) to form or affix the conductive die connectors.

The RF sub-assemblies 118 and 120 are pre-formed before being placed on the carrier substrate 204. Each of the RF sub-assemblies 118 and 120 has a top side (e.g., major side having exposed surface of the sacrificial blank) and a backside (e.g., major side having the conductive radiant element). In this embodiment, the RF sub-assemblies 118 and 120 are orientated with the top side placed on the carrier substrate 204. Each of the RF sub-assemblies 118 and 120 includes a sacrificial blank 206 having a conductive radiant element (106, 108) formed on a first major side and a surrounding conductive shield (110, 112) formed on outer sidewalls of the sacrificial blank. The patterned dielectric material 114 and 116 is formed on the first major side of the sacrificial blank and configured to electrically isolate the respective conductive radiant elements 106 and 108 from the surrounding conductive shields 110 and 112. In some embodiments, a portion of the conductive shield (110, 112) may be extended onto the first major side and in a same plane as the respective conductive radiant element (106, 108).

The sacrificial blank 206 may be formed from suitable materials such as non-crystalline glass, ceramic, quartz, plastic, polymer, and the like. The material composition of the sacrificial blank 206 is selected such that the sacrificial blank material may be etched by an etchant, melted, or dissolved without attacking an encapsulant, for example. The composition of the sacrificial blank 206 may be further chosen based on a desired coefficient of thermal expansion (CTE) property. For example, it may be desirable to choose a sacrificial blank 206 with a CTE property substantially similar to a CTE property of the encapsulant 104 to minimize package warpage. The sacrificial blank 206 may be formed in any desired shape and sidewall profile configured to form a desired cavity at a subsequent stage of manufacture. Simplified cross-sectional views of example RF sub-assemblies taken at stages of manufacture are depicted in FIG. 11 through FIG. 19.

Figure 3:
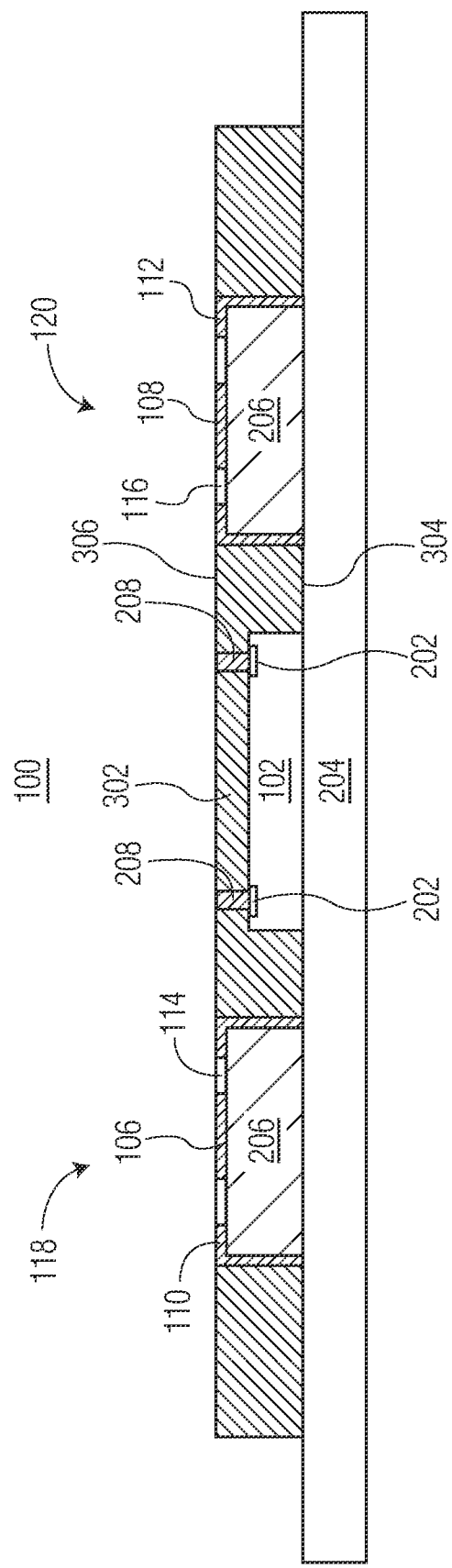

FIG. 3 illustrates, in a simplified bottom-side-up cross-sectional view, the example semiconductor device 100 taken along line A-A at a subsequent stage of manufacture in accordance with an embodiment. At this stage, the semiconductor device 100 includes the semiconductor die 102 and RF sub-assemblies 118 and 120 at least partially encapsulated with an encapsulant 302 while temporarily affixed on the carrier substrate 204. For illustration purposes, the encapsulated semiconductor device 100 has a first major side 304 formed on the carrier substrate 204 and a second major side 306 (opposite of the first major side 304). The encapsulant 302, as depicted in this cross-sectional view, corresponds to the encapsulant 104 depicted in the plan view of FIG. 1.

In this embodiment, the semiconductor die 102 and RF sub-assemblies 118 and 120 are over-molded with the encapsulant 302 by way of a molding process. The encapsulated semiconductor device 100 is then subjected to a back grind operation to expose portions of the radiant elements 106 and 108, conductive shields 110 and 112, and conductive die connectors 208 at the second major side 306. Alternatively, the semiconductor die 102 and RF sub-assem-blies 118 and 120 may be molded with the encapsulant 302 by way of a film-assisted molding (FAM) process. For example, a FAM tool using a conformal film may be engaged with predetermined portions of the radiant elements 106 and 108, conductive shields 110 and 112, and conductive die connectors 208 during the molding process to keep the predetermined portions free from encapsulant. In this manner, portions of the radiant elements 106 and 108, conductive shields 110 and 112, and conductive die connectors 208 may be exposed at the second major side 306 of the encapsulant 302 without a back grind operation.

Figure 4:
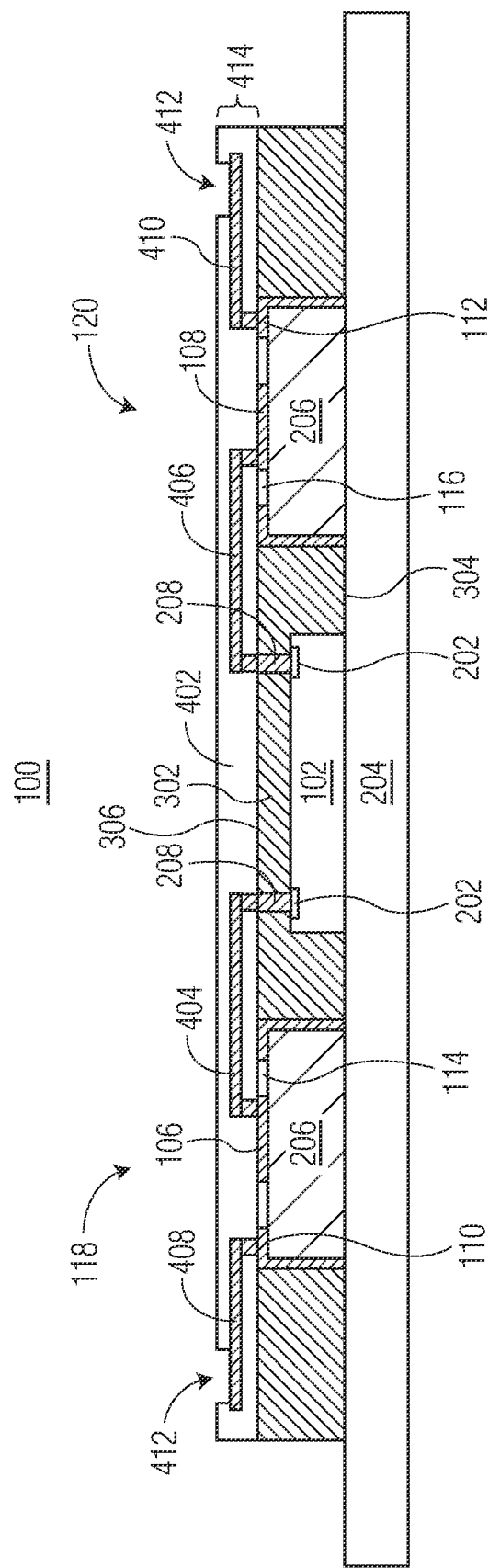

FIG. 4 illustrates, in a simplified bottom-side-up cross-sectional view, the example semiconductor device 100 taken along line A-A at a subsequent stage of manufacture in accordance with an embodiment. At this stage, an interconnecting package substrate 414 is applied to the second major side 306 of the encapsulated semiconductor device 100. After portions of the radiant elements 106 and 108, conductive shields 110 and 112, and conductive die connectors 208 are exposed at the second major side 306, the package substrate 414 is applied. The package substrate 414 includes conductive features (e.g., traces 404-410) surrounded by non-conductive material 402 (e.g., dielectric). The package substrate 414 may be formed as a build-up substrate or may be provided as a pre-formed substrate.

In this embodiment, the conductive traces 404 and 406 are formed to interconnect the semiconductor die 102 and the radiant elements 106 and 108 and the conductive traces 408 and 410 are formed to interconnect the conductive shields 110 and 112 with a printed circuit board (PCB), for example. Openings 412 in the non-conductive material 402 expose portions of traces 408 and 410 configured for attachment of conductive connectors at a subsequent stage of manufacture.

Figure 5:
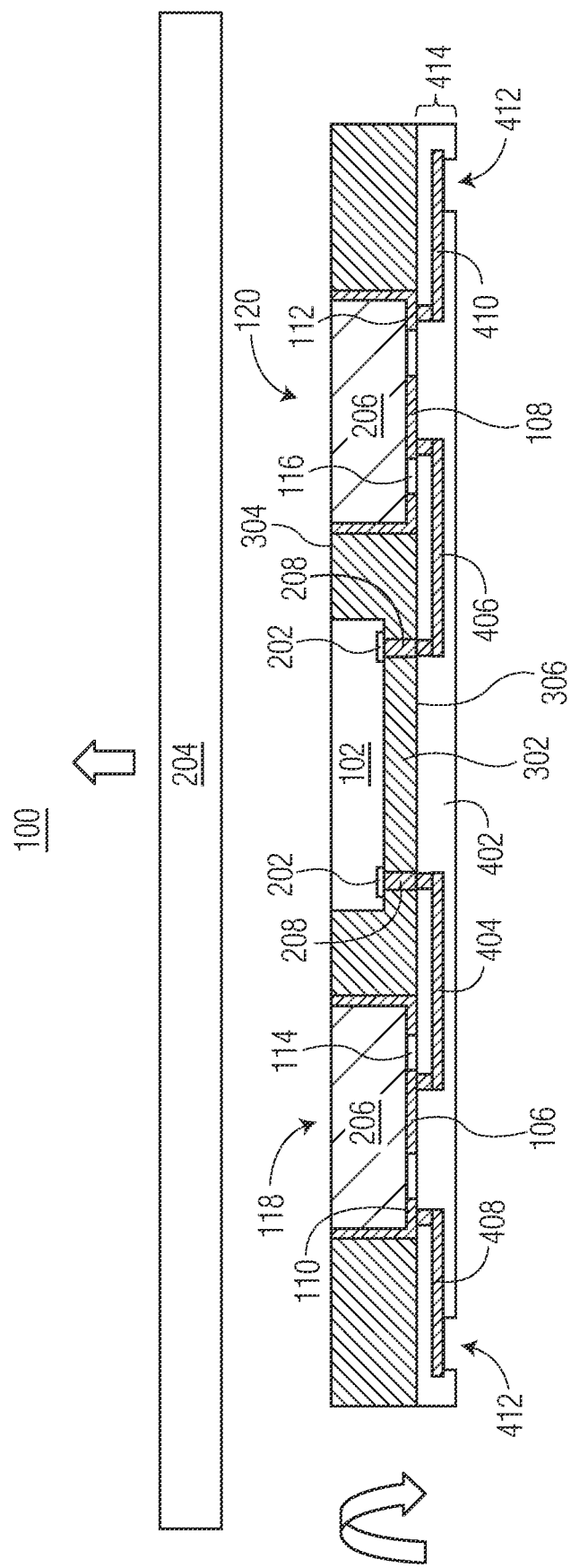

FIG. 5 illustrates, in a simplified cross-sectional view, the example semiconductor device 100 taken along line A-A at a subsequent stage of manufacture in accordance with an embodiment. At this stage, the encapsulated semiconductor device 100 is separated from the carrier substrate 204 and reoriented (e.g., flipped). The backside of the semiconductor die 102 and a second major side (opposite of the first major side) of the sacrificial blanks 206 are exposed at the first major side 304 of encapsulated semiconductor device 100 when the carrier substrate 204 is removed.

Figure 6:
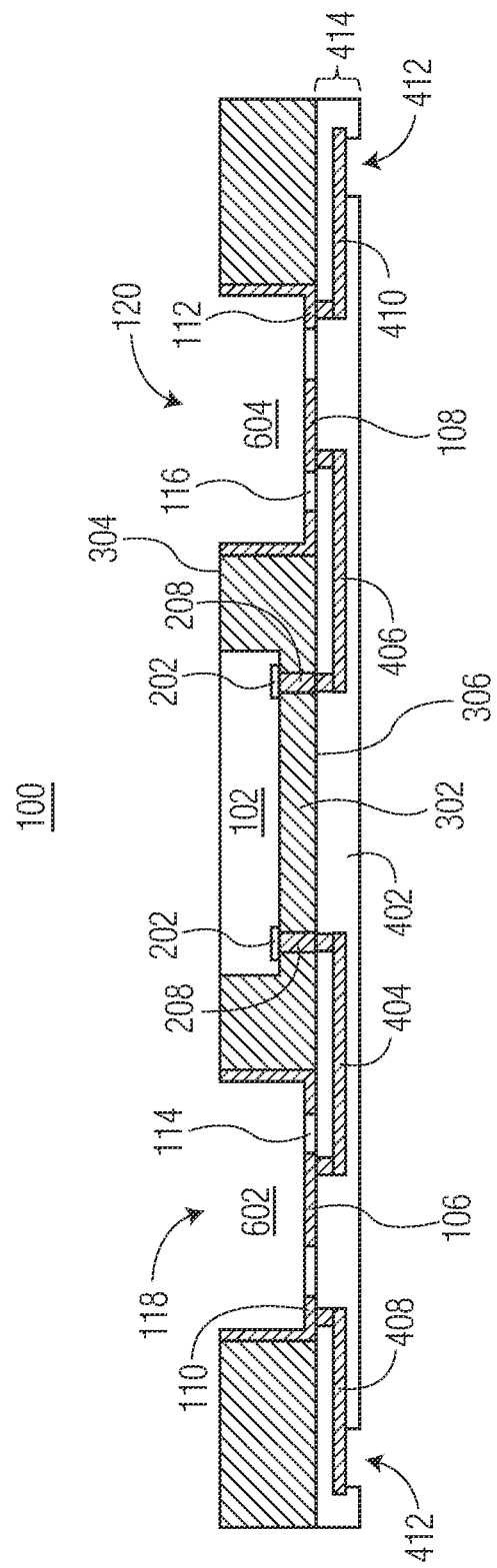

FIG. 6 illustrates, in a simplified cross-sectional view, the example semiconductor device 100 taken along line A-A at a subsequent stage of manufacture in accordance with an embodiment. At this stage, the sacrificial blanks (206) are removed to form cavities 602 and 604 in respective RF sub-assemblies 118 and 120. The sacrificial blanks may be etched by an etchant, melted, or dissolved by way of suitable processes to form cavities 602 and 604. In this embodiment, the composition of the sacrificial blanks allows for the sacrificial blank material to be etched by an etchant that does not etch or otherwise attack the encapsulant 302, radiant elements 106 and 108, and conductive shields 110 and 112, for example. After the sacrificial blank is removed, surfaces of the radiant elements 106 and 108, conductive shields 110 and 112, and isolating dielectric material 114 and 116 are exposed through the respective cavities 602 and 604. The conductive shields 110 and 112 are configured for subsequent connection to a ground voltage supply by way of traces 408 and 410 of the package substrate 414, for example.

Figure 7A:
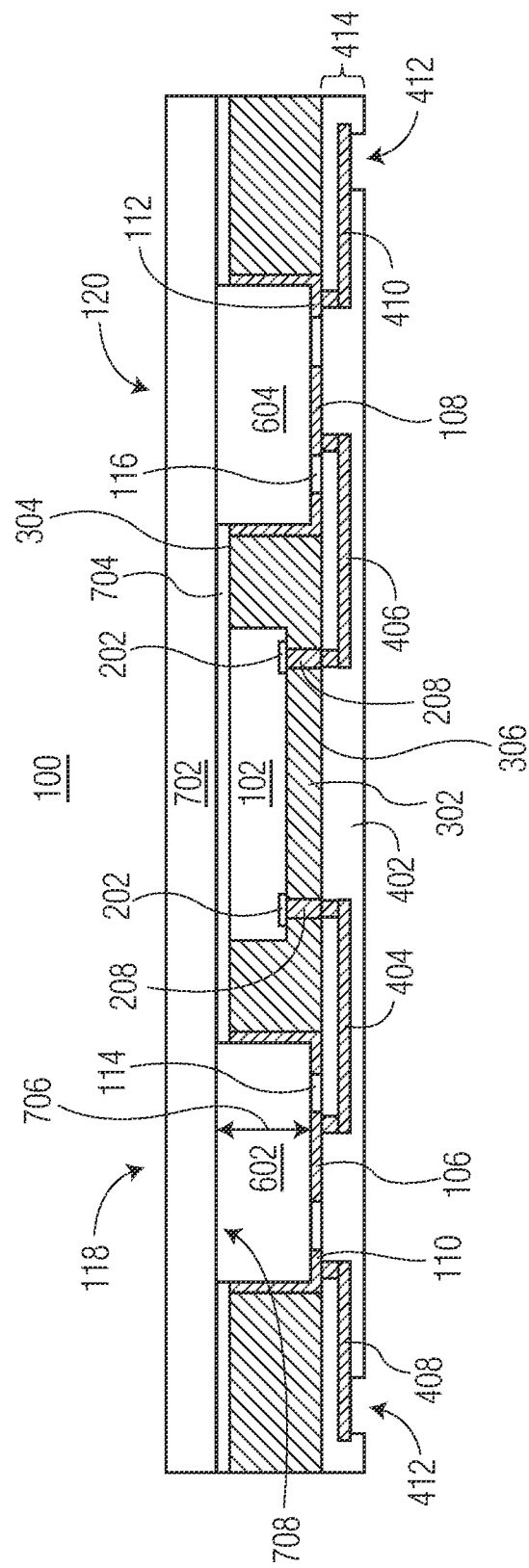

FIG. 7A illustrates, in a simplified cross-sectional view, the example semiconductor device 100 taken along line A-A at a subsequent stage of manufacture in accordance with an embodiment. At this stage, a pre-formed conductive package lid 702 is affixed on the first major side 304 of encapsulated semiconductor device 100 to enclose cavities 602 and 604. In this embodiment, the package lid 702 is affixed on the first major side 304 of the encapsulated semiconductor device 100 by way of a conductive adhesive 704. The package lid may be formed from a suitable conductive material or a conductive metal coated material (e.g., metal coated laminate, metal coated plastic). With the package lid 702 attached, a continuous conductive resonant cavity is formed. The enclosed cavities 602 and 604 may be filled with air or other suitable low loss materials (e.g., gas, foam) having suitable dissipation factor (e.g., Df value in a range of 0 to 0.001) and dielectric constant (e.g., Dk value in a range of 1 to 3) properties. In this embodiment, the package lid 702 portion over the cavities 602 and 604 is configured to serve as a signal reflector 708 to increase gain for propagation of RF signals such as 5G, 6G, and radar signals having frequencies of 20 GHz and higher. The signal reflector 708 portion of the package lid 702 over the cavities 602 and 604 is located at a predetermined distance 706 from radiant elements 106 and 108 for a desired resonant frequency and bandwidth.

Figure 7B:
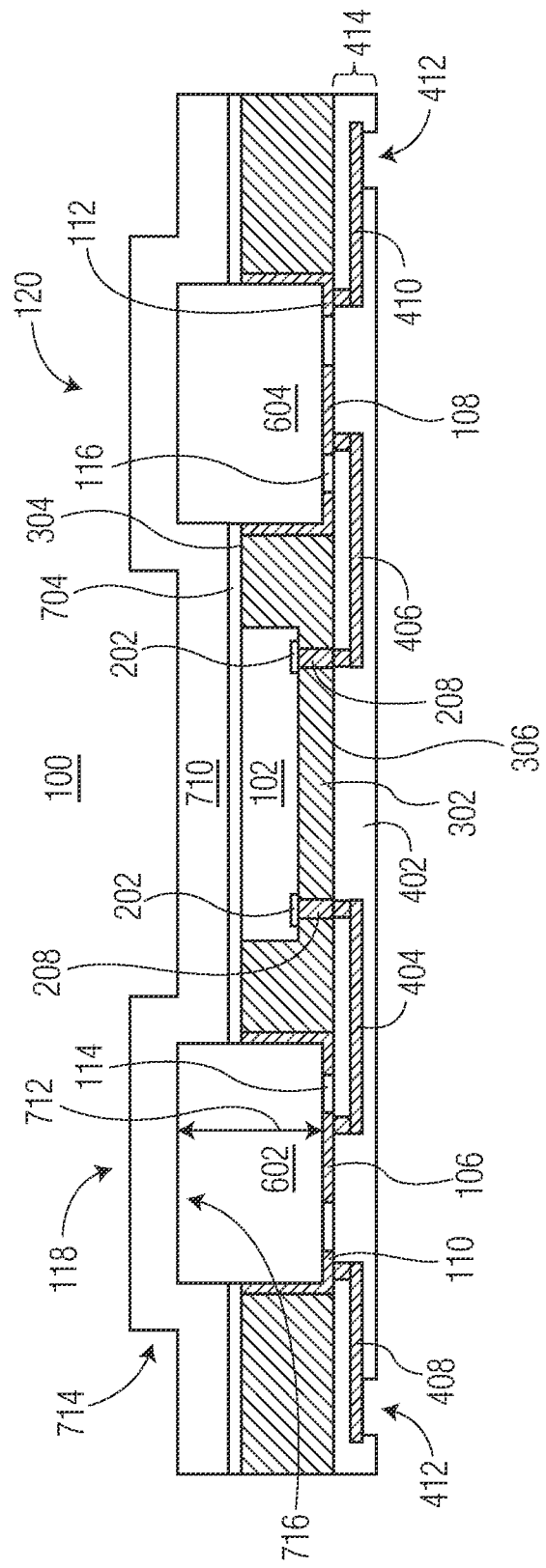

FIG. 7B illustrates, in a simplified cross-sectional view, the example semiconductor device 100 taken along line A-A at an alternative stage of manufacture in accordance with an embodiment. At this stage, an alternative pre-formed conductive package lid 710 is affixed on the first major side 304 of encapsulated semiconductor device 100 to enclose cavities 602 and 604. The package lid 710 depicted in FIG. 7B may be characterized as an alternative to the package lid 702 depicted in FIG. 7A. In this embodiment, the package lid 710 includes tunable recesses 714 which are vertically aligned with cavities 602 and 604. For example, with the package lid 710 formed from a metal material, the recesses 714 may be tunable by forming the recesses to a desired depth during a stamping process. The signal reflector 716 portion of the recesses 714 over the cavities 602 and 604 is configured to provide an extended predetermined distance 712 from radiant elements 106 and 108 for increased gain and a desired resonant frequency and bandwidth. By forming recesses 714 in the package lid, desired resonant frequencies and bandwidths can be realized without being limited to the depth of cavities 602 and 604.

Figure 8:
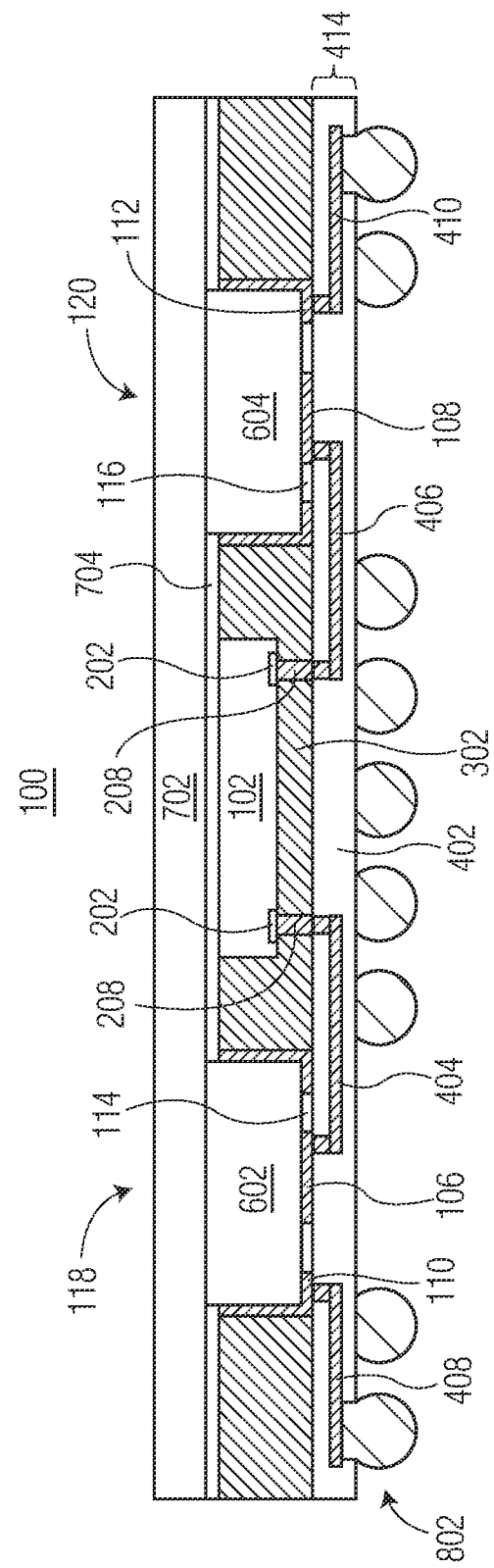

FIG. 8 illustrates, in a simplified cross-sectional view, the example semiconductor device 100 taken along line A-A at a subsequent stage of manufacture in accordance with an embodiment. At this stage, conductive connectors 802 (e.g., solder balls) are affixed to a bottom side of the package substrate 414. The conductive connectors 802 are configured and arranged to provide conductive connections between the semiconductor device 100 and a PCB, for example. The conductive shields 110 and 112 of the RF sub-assemblies 118 and 120 may be interconnected to a ground voltage supply by way of traces 408 and 410 and conductive connectors 802, for example. The conductive connectors 802 may be in the form of any suitable conductive structures such as solder balls, gold studs, copper pillars, and the like, to connect conductive features of the semiconductor device 100 with the PCB. As an alternative to attaching conductive connectors 802, the exposed portions of conductive traces 408 and 410 (e.g., FIG. 7A) may be plated for subsequent connection with the PCB by way of solder paste attachment or other suitable conductive attachment processes (e.g., ACF, ACP).

Figure 9:
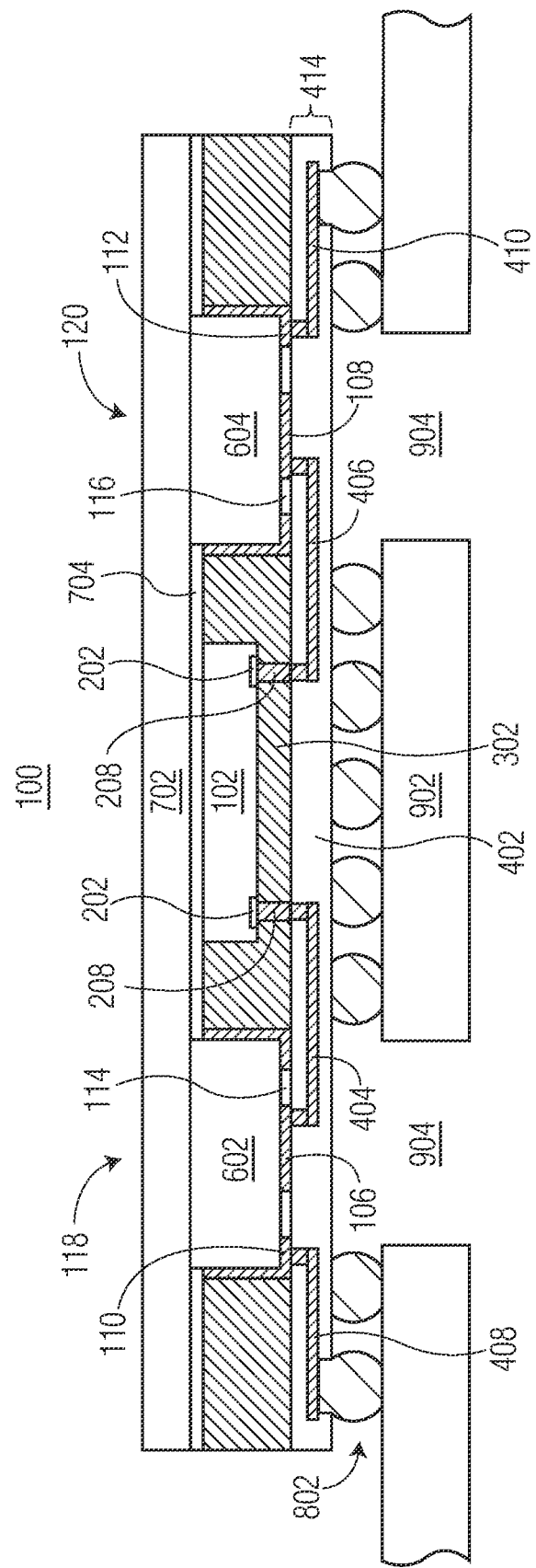

FIG. 9 illustrates, in a simplified cross-sectional view, the example semiconductor device 100 taken along line A-A at a subsequent stage of manufacture in accordance with an embodiment. At this stage, the semiconductor device 100 is attached to an example PCB 902. In this embodiment, the semiconductor device 100 is configured in a downward firing arrangement. The PCB 902 includes through openings 904 substantially vertically aligned with the cavity sidewalls of the RF sub-assemblies 118 and 120 to allow for propagation of RF signals through the PCB. In some embodiments, the sidewalls of the openings 904 may be formed with a metal lining to reduce RF signal radiation from propagating laterally. In this embodiment, the conductive connectors 802 attached at the bottom of the package substrate 414 are affixed to a top side of the PCB using known techniques and materials. Conductive (e.g., metal) features of the PCB are not shown for illustrative purposes.

Figure 10:
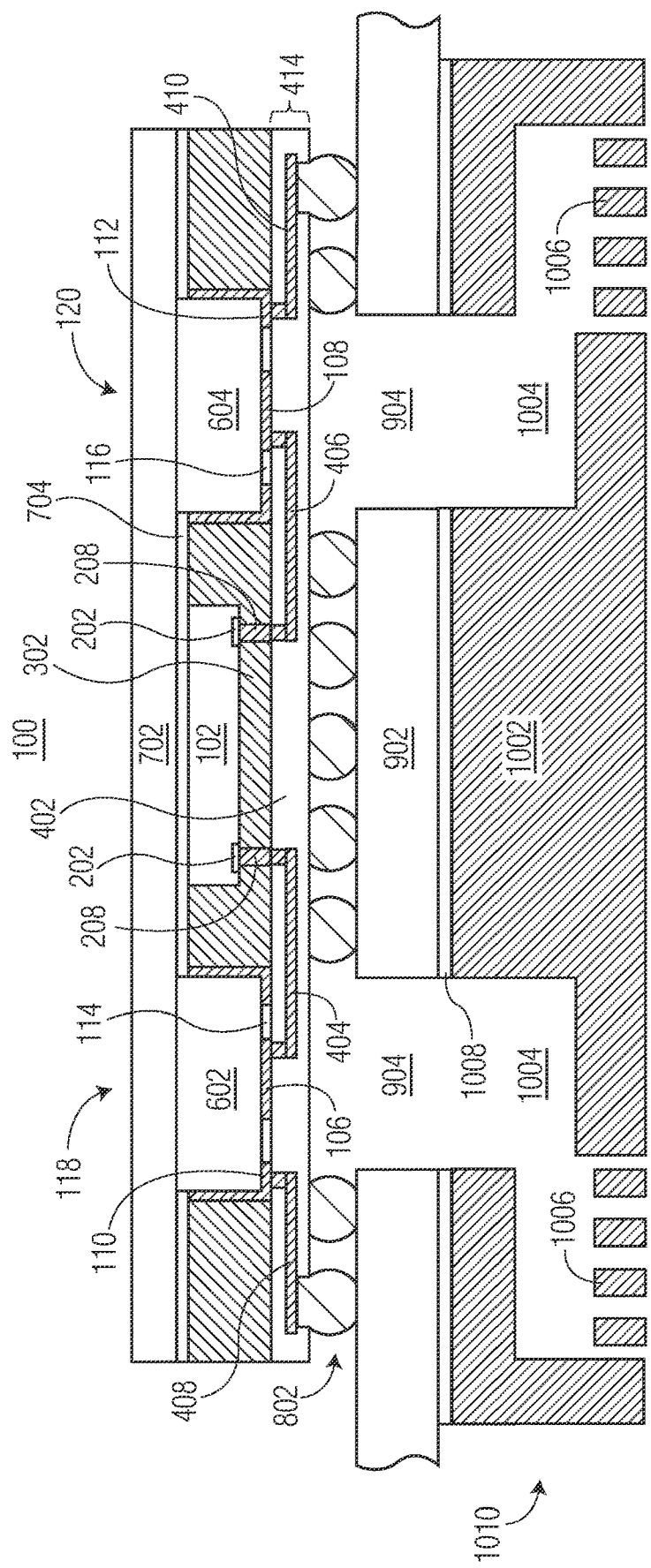

FIG. 10 illustrates, in a simplified cross-sectional view, the example semiconductor device 100 taken along line A-A at a subsequent stage of manufacture in accordance with an embodiment. At this stage, a waveguide structure 1010 is aligned and attached to the PCB 902. In this embodiment, the waveguide structure 1010 is attached to a bottom side of the PCB 902 by way of an adhesive 1008. In some embodiments, the adhesive 1008 may be characterized as a conductive adhesive configured to minimize RF signal radiation from propagating laterally at the PCB 902 to waveguide structure 1010 interface.

In this embodiment, the waveguide structure 1010 includes waveguides 1004 formed in a waveguide body 1002. Waveguide antennas 1006 are located at the distal ends of the waveguides 1004. In this embodiment, the waveguide structure 1010 may be characterized as an air cavity waveguide having slot antennas. For example, the waveguide body 1002 may be formed from a metal, plastic, or laminate material with the waveguides 1004 formed as air cavities. The waveguides 1004 may be formed with a metal lining when the waveguide body 1002 is formed from a plastic or laminate material, for example.

Figure 11:
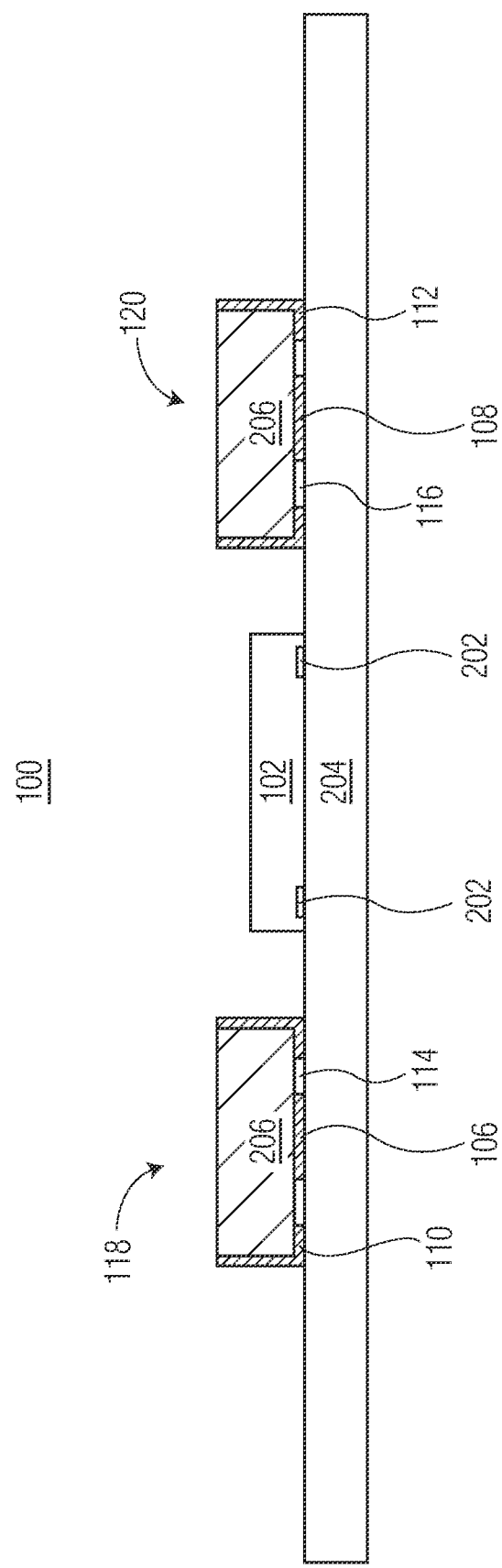
FIG. 11 through FIG. 13 illustrate, in simplified cross-sectional views, the example semiconductor device at alternative stages of manufacture in accordance with an embodiment.
Figure 12:
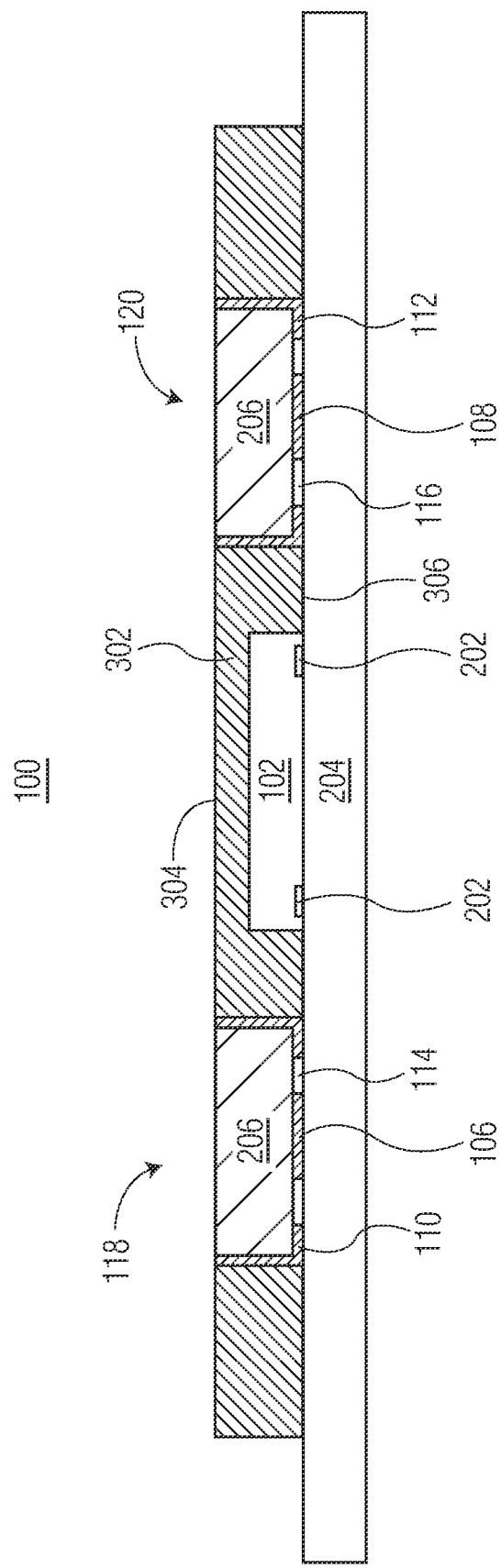
Figure 13:
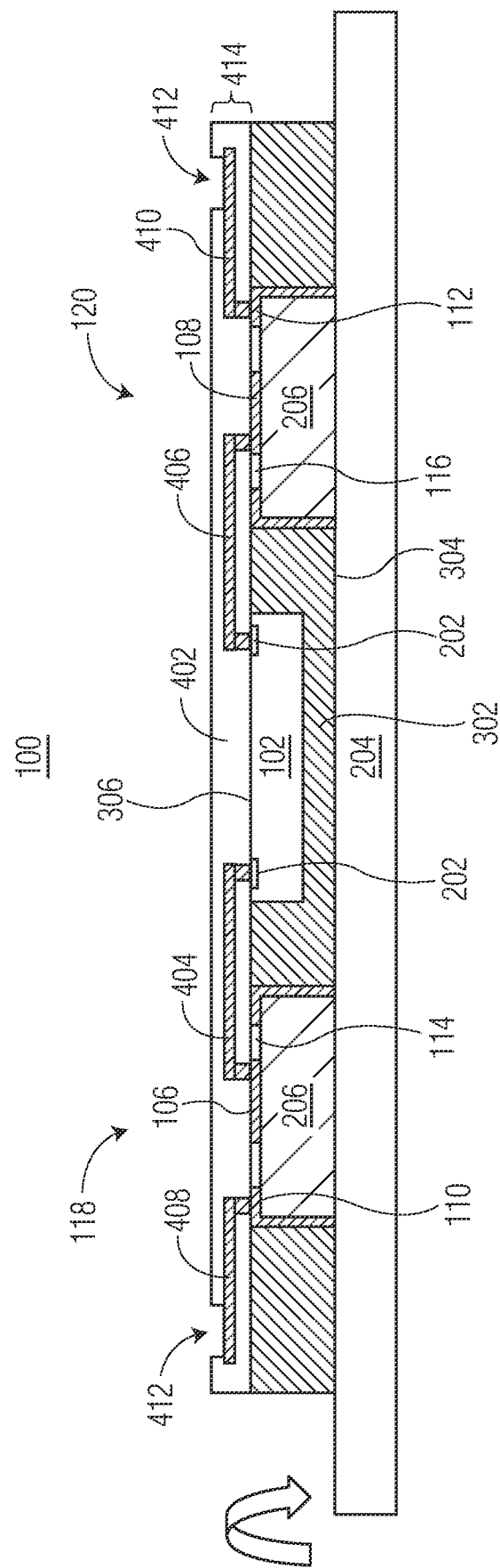

FIG. 11 through FIG. 13 illustrate, in simplified cross-sectional views, the example semiconductor device 100 taken along line A-A at alternative stages of manufacture in accordance with an embodiment. The stages of manufacture depicted in FIG. 11 through FIG. 13 are an alternative to the stages of manufacture of the example semiconductor device 100 depicted in FIG. 2 through FIG. 4, with stages of manufacture depicted in FIG. 5 through FIG. 10 remaining substantially similar.

FIG. 11 illustrates, in a simplified top-side-up cross-sectional view, the example semiconductor device 100 taken along line A-A at an alternative stage of manufacture in accordance with an embodiment. At this stage, the semiconductor device 100 includes the semiconductor die 102 and pre-formed RF sub-assemblies 118 and 120 placed on a carrier substrate 204. In this embodiment, the semiconductor die 102 is configured in an active-side-down orientation with the active side placed on the carrier substrate 204 and the RF sub-assemblies 118 and 120 are orientated with the backside placed on the carrier substrate 204. By arranging the semiconductor die 102 and the RF sub-assemblies 118 and 120 in this manner on the carrier substrate 204, the conductive die connectors 208 depicted in FIG. 2 may be eliminated.

FIG. 12 illustrates, in a simplified top-side-up cross-sectional view, the example semiconductor device 100 taken along line A-A at a subsequent stage of manufacture in accordance with an embodiment. At this stage, the semiconductor device 100 includes the semiconductor die 102 and RF sub-assemblies 118 and 120 at least partially encapsulated with encapsulant 302 while temporarily affixed on the carrier substrate 204. In this embodiment, the semiconductor die 102 and RF sub-assemblies 118 and 120 are over-molded with the encapsulant 302 by way of a molding process. The encapsulated semiconductor device 100 is then subjected to a back grind operation to expose the top sides of the RF sub-assemblies 118 and 120 and surface of the sacrificial blanks 206 at the first major side 304 the encapsulated semiconductor device 100. Alternatively, the semiconductor die 102 and RF sub-assemblies 118 and 120 may be molded with the encapsulant 302 by way of a FAM process. For example, a FAM tool using a conformal film may be engaged with predetermined portions of the top side of the RF sub-assemblies 118 and 120 during the molding process to keep the predetermined portions free from encapsulant. In this manner, the top sides of the RF sub-assemblies 118 and 120 and surface of the sacrificial blanks 206 may be exposed at the first major side 304 the encapsulated semiconductor device 100 without using a back grind operation.

FIG. 13 illustrates, in a simplified bottom-side-up cross-sectional view, the example semiconductor device 100 taken along line A-A at a subsequent stage of manufacture in accordance with an embodiment. At this stage, the interconnecting package substrate 414 is applied to the second major side 306 of the encapsulated semiconductor device 100. In this embodiment, the encapsulated semiconductor device 100 is separated from the carrier substrate 204, reoriented (e.g., flipped) and placed onto a carrier substrate (e.g., carrier substrate 204 or other carrier substrate). After the encapsulated semiconductor device 100 is separated from the carrier substrate 204, portions of the radiant elements 106 and 108, conductive shields 110 and 112, and bond pads 202 are exposed at the second major side 306.

Similar to the embodiment of FIG. 4 described above, the package substrate 414 is applied to the second major side 306. The conductive traces 404 and 406 are formed to interconnect the semiconductor die 102 and the radiant elements 106 and 108 and the conductive traces 408 and 410 are formed to interconnect the conductive shields 110 and 112 with a PCB. For example, the conductive shields 110 and 112 are configured for subsequent connection to a ground voltage supply by way of traces 408 and 410 of the package substrate 414. Openings 412 in the non-conductive material 402 expose portions of traces 408 and 410 configured for attachment of conductive connectors at a subsequent stage of manufacture (e.g., FIG. 8). The package substrate 414 may be formed as a build-up substrate or may be provided as a pre-formed substrate. After the package substrate 414 is applied to the second major side 306 of the encapsulated semiconductor device 100, subsequent stages of manufacture are depicted in FIG. 5 through FIG. 10 accordingly.

FIG. 14 through FIG. 18 illustrate, in simplified cross-sectional views, an example RF sub-assembly at stages of manufacture in accordance with an embodiment. The RF sub-assembly depicted in FIG. 14 through FIG. 18 corresponds to the pre-formed RF sub-assemblies 118 and 120 of the semiconductor device 100, for example.

Figure 14:
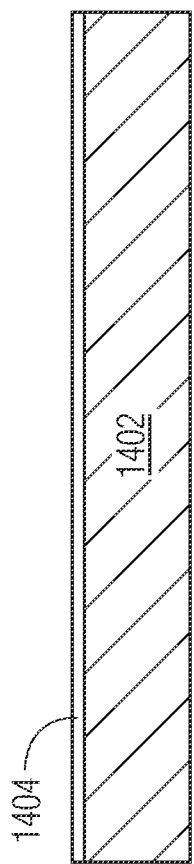
FIG. 14 through FIG. 18 illustrate, in simplified cross-sectional views, an example RF sub-assembly of the example semiconductor device at stages of manufacture in accordance with an embodiment.

FIG. 14 illustrates, in a simplified cross-sectional view, the example RF sub-assembly at a stage of manufacture in accordance with an embodiment. At this stage, a bulk sacrificial blank 1402 is provided and a dielectric layer 1404 is formed on a first major side of the sacrificial blank. The sacrificial blank 1402 may be formed from suitable materials such as non-crystalline glass, ceramic, quartz, plastic, polymer, and the like. The material composition of the sacrificial blank 1402 is selected such that the sacrificial blank material may be subsequently removed by way of etching, melting, or dissolving, for example. The dielectric layer 1404 may be formed from suitable non-conductive materials such as Ajinomoto build-up film (ABF), for example.

Figure 15:
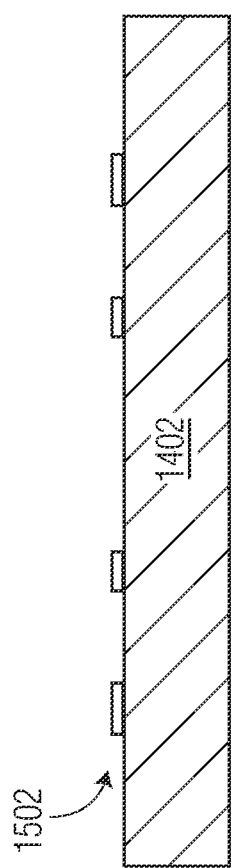

FIG. 15 illustrates, in a simplified cross-sectional view, the example RF sub-assembly at a subsequent stage of manufacture in accordance with an embodiment. At this stage, the dielectric layer 1404 formed on the first major side of the sacrificial blank 1402 is patterned to form isolation structures 1502. The isolation structures 1502 are configured to electrically isolate conductive radiant elements and respective surrounding conductive shields formed at a subsequent stage.

Figure 16:
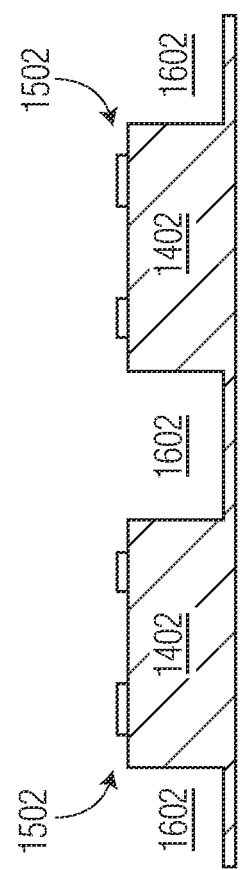

FIG. 16 illustrates, in a simplified cross-sectional view, the example RF sub-assembly at a subsequent stage of manufacture in accordance with an embodiment. At this stage, the sacrificial blank 1402 is partially sawn to form singulation grooves 1602. In this embodiment, the singulation grooves 1602 are formed by way of a mechanical saw process, for example. The singulation grooves 1602 are sawn to a significant depth of the bulk sacrificial blank 1402 such that individual RF sub-assemblies may be singulated at a subsequent stage. In some embodiments, the singulation grooves 1602 may be formed by way of laser ablation, patterned plasma etching, or other suitable material removal process.

Figure 17:
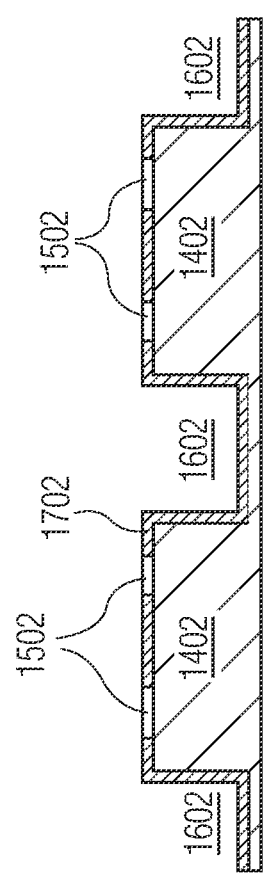

FIG. 17 illustrates, in a simplified cross-sectional view, the example RF sub-assembly at a subsequent stage of manufacture in accordance with an embodiment. At this stage, a conductive (e.g., metal) layer 1702 is formed on the sacrificial blank 1402. In this embodiment, the upper surfaces of the sacrificial blank 1402 are selectively plated (e.g., isolation structures 1502 not plated) with a suitable metal or metal alloy (e.g., copper) material to form radiant element and conductive shield regions. In this embodiment, the conductive layer 1702 and the isolation structures 1502 are substantially coplanar at the top surface of the sacrificial blank 1402. A seed layer (not shown) may be formed on the exposed upper surfaces of the sacrificial blank 1402 to facilitate a plating process, for example. In other embodiments, other metallization techniques may be utilized to form the conductive layer 1702.

Figure 18:
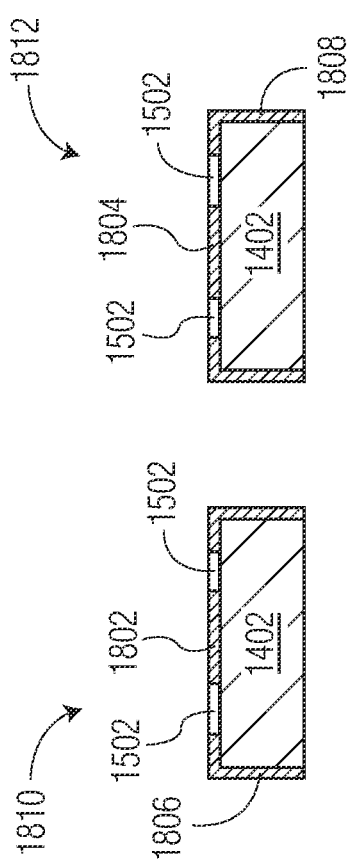

FIG. 18 illustrates, in a simplified cross-sectional view, the example RF sub-assembly at a subsequent stage of manufacture in accordance with an embodiment. At this stage, RF sub-assemblies are singulated. In this embodiment, the back side of the sacrificial blank 1402 is subjected to a back grind operation to singulate the RF sub-assemblies 1810 and 1812. Each of the RF sub-assemblies 1810 and 1812 includes a sacrificial blank 1402, a radiant element (1802, 1804), and a surrounding conductive shield (1806, 1808). The patterned dielectric material 1502 is configured and arranged to electrically isolate the conductive radiant elements 1802 and 1804 from the respective conductive shields 1806 and 1808. The size, shape, and number of singulated RF sub-assemblies 1810 and 1812 are chosen for illustration purposes.

FIG. 19 through FIG. 22 illustrate, in simplified cross-sectional views, an alternative example RF sub-assembly at stages of manufacture in accordance with an embodiment. The alternative RF sub-assembly depicted in FIG. 19 through FIG. 22 may be characterized as a multichannel RF sub-assembly having at least two RF sub-assembly portions share a common conductive isolation sidewall, for example.

Figure 19:
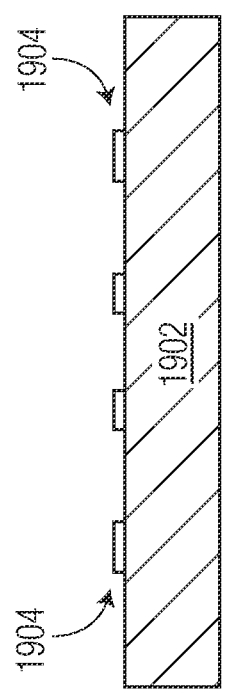
FIG. 19 through FIG. 22 illustrate, in simplified cross-sectional views, an alternative example RF sub-assembly of the example semiconductor device at stages of manufacture in accordance with an embodiment.

FIG. 19 illustrates, in a simplified cross-sectional view, the alternative RF sub-assembly at a stage of manufacture in accordance with an embodiment. At this stage, a bulk sacrificial blank 1902 is provided and a dielectric layer is patterned to form isolation structures 1904 on a first major side of the sacrificial blank. The isolation structures 1904 are configured to electrically isolate conductive radiant elements and respective surrounding conductive shields formed at a subsequent stage, for example. The sacrificial blank 1902 may be formed from suitable materials such as non-crystalline glass, ceramic, quartz, plastic, polymer, and the like. The material composition of the sacrificial blank 1902 is selected such that the sacrificial blank material may be subsequently removed by way of etching, melting, or dissolving, for example. The isolation structures 1904 may be formed from suitable non-conductive materials such as ABF, for example.

Figure 20:
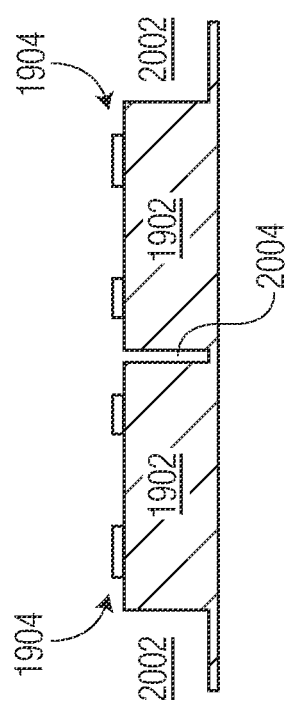

FIG. 20 illustrates, in a simplified cross-sectional view, the alternative RF sub-assembly at a subsequent stage of manufacture in accordance with an embodiment. At this stage, the sacrificial blank 1902 is partially sawn to form singulation grooves 2002 and isolation groove 2004. In this embodiment, the singulation grooves 2002 and isolation grooves 2004 are formed by way of a mechanical saw process, for example. The singulation grooves 2002 are sawn to a significant depth of the bulk sacrificial blank 1902 such that (e.g., multichannel) RF sub-assemblies may be singulated at a subsequent stage. In some embodiments, the singulation grooves 2002 and isolation grooves 2004 may be formed by way of laser ablation, patterned plasma etching, or other suitable material removal process.

Figure 21:
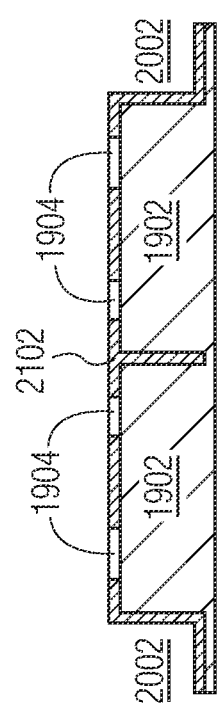

FIG. 21 illustrates, in a simplified cross-sectional view, the alternative RF sub-assembly at a subsequent stage of manufacture in accordance with an embodiment. At this stage, a conductive (e.g., metal) layer 2102 is formed on the sacrificial blank 1902. In this embodiment, the upper surfaces of the sacrificial blank 1902 are selectively plated (e.g., isolation structures 1904 not plated) with a suitable metal or metal alloy (e.g., copper) material to form radiant element and conductive shield regions. In this embodiment, the conductive layer 2102 and the isolation structures 1904 are substantially coplanar at the top surface of the sacrificial blank 1902. A seed layer (not shown) may be formed on the exposed upper surfaces of the sacrificial blank 1902 to facilitate a plating process, for example.

Figure 22:
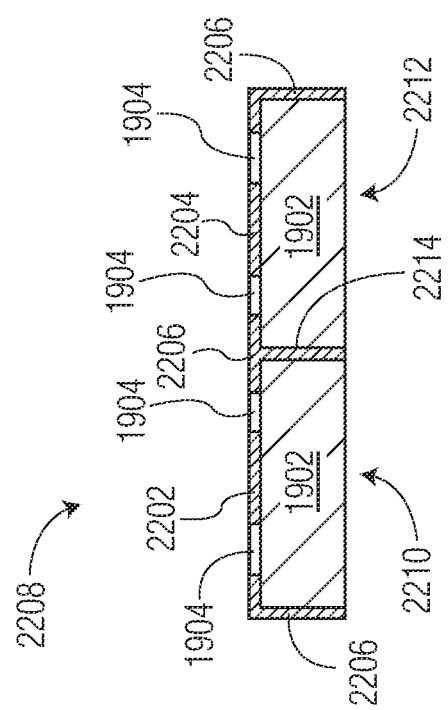

FIG. 22 illustrates, in a simplified cross-sectional view, the alternative RF sub-assembly at a subsequent stage of manufacture in accordance with an embodiment. At this stage, multichannel RF sub-assemblies 2208 are singulated. In this embodiment, the back side of the sacrificial blank 1902 is subjected to a back grind operation to singulate the multichannel RF sub-assemblies 2208. In this embodiment, each of the multichannel RF sub-assemblies 2208 includes a first RF sub-assembly portion 2210 and a second RF sub-assembly portion 2212 sharing a common conductive isolation sidewall 2214. Each of the RF sub-assembly portions 2210 and 212 includes a sacrificial blank 1902, a radiant element (2202, 2204), and a surrounding conductive shield 2206 with shared conductive isolation sidewall 2214. The patterned dielectric material 1904 is configured and arranged to electrically isolate the conductive radiant elements 2202 and 2204 from the conductive shield 2206. The size, shape, and number of multichannel RF sub-assembly portions 2210 and 2212 of the multichannel RF sub-assemblies 2208 and are chosen for illustration purposes.

Generally, there is provided, a method of manufacturing a semiconductor device including placing a semiconductor die on a carrier substrate; placing a radio frequency (RF) sub-assembly on the carrier substrate, the RF sub-assembly comprising a sacrificial blank; a conductive radiant element formed on a first side of the sacrificial blank; and a conductive shield formed at least on outer sidewalls of the sacrificial blank; encapsulating with an encapsulant at least a portion of the semiconductor die and the RF sub-assembly; separating the carrier substrate from a first major side of the encapsulated semiconductor die and RF sub-assembly to expose a second side of the sacrificial blank; removing the sacrificial blank to form a cavity in the RF sub-assembly, the conductive radiant element and the conductive shield exposed through the cavity; and affixing a package lid on the first major side of the encapsulated semiconductor die and RF sub-assembly, the package lid configured to serve as a signal reflector for propagation of an RF signal. The method may further include forming a package substrate on a second major side of the encapsulated semiconductor die and RF sub-assembly. The package substrate may include a conductive trace interconnecting a bond pad of the semiconductor die and the conductive radiant element. The method may further include affixing conductive connectors to a bottom side of the package substrate, the conductive connectors configured and arranged to provide conductive connections between the semiconductor device and a printed circuit board (PCB). The semiconductor device may be arranged in a downward firing configuration and configured for propagation of the RF signal through an opening in the PCB, the opening vertically aligned with the cavity. The cavity may be substantially filled with a low loss dielectric material. The conductive radiant element and the conductive shield may be formed by way of a same metallization process step. The package lid may be further configured to increase gain of the RF signal when transmitted or received by way of the conductive radiant element. The package lid may be affixed to the second major side of the encapsulated semiconductor die and RF sub-assembly by way of a conductive adhesive material.

In another embodiment, there is provided, a method of manufacturing a semiconductor device including placing a semiconductor die on a carrier substrate; placing a radio frequency (RF) sub-assembly on the carrier substrate, the RF sub-assembly comprising a sacrificial blank; a patterned dielectric material formed on a first side of the sacrificial blank; a conductive radiant element formed on the first side of the sacrificial blank, the conductive radiant element formed in a same horizontal plane as the patterned dielectric material; and a conductive shield formed at least on outer sidewalls of the sacrificial blank; encapsulating with an encapsulant at least a portion of the semiconductor die and the RF sub-assembly; separating the carrier substrate from a first major side of the encapsulated semiconductor die and RF sub-assembly to expose a second side of the sacrificial blank; etching the sacrificial blank to form a cavity in the RF sub-assembly, the conductive radiant element and the conductive shield exposed through the cavity; and affixing a package lid on the first major side of the encapsulated semiconductor die and RF sub-assembly, the package lid configured to serve as a signal reflector for propagation of an RF signal. The conductive radiant element and the conductive shield may be formed by way of a same metallization process step. The method patterned dielectric material may be configured and arranged to electrically isolate the conductive radiant element from the conductive shield. The method of claim 10, wherein the package lid may be affixed to the second major side of the encapsulated semiconductor die and RF sub-assembly by way of a conductive adhesive material. The method may further include forming a package substrate on a second major side of the encapsulated semiconductor die and RF sub-assembly, the package substrate including a conductive trace interconnecting a bond pad of the semiconductor die and the conductive radiant element.

The method may further include affixing conductive connectors to a bottom side of the package substrate, the conductive connectors configured and arranged to provide conductive connections between the semiconductor device and a printed circuit board (PCB) wherein the PCB includes a through opening vertically aligned with the cavity.

In yet another embodiment, there is provided, a method of manufacturing a semiconductor device including placing a semiconductor die on a carrier substrate; placing a radio frequency (RF) sub-assembly on the carrier substrate, the RF sub-assembly comprising a sacrificial blank; a patterned dielectric material formed on a first side of the sacrificial blank; a conductive radiant element formed on the first side of the sacrificial blank; and a conductive shield formed at least on outer sidewalls of the sacrificial blank, the patterned dielectric material configured to electrically isolate the conductive radiant element from the conductive shield; encapsulating with an encapsulant at least a portion of the semiconductor die and the RF sub-assembly; separating the carrier substrate from a first major side of the encapsulated semiconductor die and RF sub-assembly to expose a second side of the sacrificial blank; etching the sacrificial blank to form a cavity in the RF sub-assembly, the conductive radiant element and the conductive shield exposed through the cavity; and affixing a package lid on the first major side of the encapsulated semiconductor die and RF sub-assembly, the package lid enclosing the cavity. The package lid may be configured to serve as a signal reflector for propagation of an RF signal transmitted or received by way of the conductive radiant element. The portion of the package lid enclosing the cavity may be substantially parallel to a bottom surface of the cavity and spaced a predetermined distance from the conductive radiant element at the bottom surface of the cavity. The method may further include forming a package substrate on a second major side of the encapsulated semiconductor die and RF sub-assembly, the package substrate including a conductive trace interconnecting a bond pad of the semiconductor die and the conductive radiant element. The semiconductor device may be configured for propagation of the RF signal through an opening in an attached printed circuit board (PCB), the opening vertically aligned with the cavity.

By now, it should be appreciated that there has been provided a semiconductor device with an enclosed resonant RF cavity. The semiconductor device includes a semiconductor die and a pre-formed RF sub-assembly at least partially encapsulated with an encapsulant while on a carrier substrate. The RF sub-assembly includes a sacrificial blank having a conductive radiant element formed on a first major side and a surrounding conductive shield formed partially on the first major side and on outer sidewalls. After encapsulation, portions of the radiant element, conductive shield, and conductive die connectors are exposed. The semiconductor die is interconnected with the radiant element by way of a package substrate and associated die connectors. After the carrier substrate is removed, a second major side of the sacrificial blank is exposed. The sacrificial blank is subsequently removed to form a cavity having the radiant element and surrounding shield exposed in the cavity. A conductive lid is attached to enclose the cavity, thus forming a resonant RF cavity. By forming the semiconductor device with the enclosed resonant RF cavity in this manner, low loss RF signal propagation can be realized.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of manufacturing a semiconductor device, the method comprising:
   placing a semiconductor die on a carrier substrate;
   placing a radio frequency (RF) sub-assembly on the carrier substrate, the RF sub-assembly comprising:
      a sacrificial blank;
      a conductive radiant element formed on a first side of the sacrificial blank; and
      a conductive shield formed at least on outer sidewalls of the sacrificial blank;
   encapsulating with an encapsulant at least a portion of the semiconductor die and the RF sub-assembly;
   separating the carrier substrate from a first major side of the encapsulated semiconductor die and RF sub-assembly to expose a second side of the sacrificial blank;
   removing the sacrificial blank to form a cavity in the RF sub-assembly, the conductive radiant element and the conductive shield exposed through the cavity; and
   affixing a package lid on the first major side of the encapsulated semiconductor die and RF sub-assembly, the package lid configured to serve as a signal reflector for propagation of an RF signal.

2. The method of claim 1, further comprising forming a package substrate on a second major side of the encapsulated semiconductor die and RF sub-assembly.

3. The method of claim 2, wherein the package substrate includes a conductive trace interconnecting a bond pad of the semiconductor die and the conductive radiant element.

4. The method of claim 2, further comprising affixing conductive connectors to a bottom side of the package substrate, the conductive connectors configured and arranged to provide conductive connections between the semiconductor device and a printed circuit board (PCB).

5. The method of claim 4, wherein the semiconductor device is arranged in a downward firing configuration and configured for propagation of the RF signal through an opening in the PCB, the opening vertically aligned with the cavity.

6. The method of claim 1, wherein the cavity is substantially filled with a low loss dielectric material.

7. The method of claim 1, wherein the conductive radiant element and the conductive shield are formed by way of a same metallization process step.

8. The method of claim 1, wherein the package lid is further configured to increase gain of the RF signal when transmitted or received by way of the conductive radiant element.

9. The method of claim 1, wherein the package lid is affixed to the second major side of the encapsulated semiconductor die and RF sub-assembly by way of a conductive adhesive material.

10. A method of manufacturing a semiconductor device, the method comprising:
   placing a semiconductor die on a carrier substrate;
   placing a radio frequency (RF) sub-assembly on the carrier substrate, the RF sub-assembly comprising:
      a sacrificial blank;
      a patterned dielectric material formed on a first side of the sacrificial blank;
      a conductive radiant element formed on the first side of the sacrificial blank, the conductive radiant element formed in a same horizontal plane as the patterned dielectric material; and
      a conductive shield formed at least on outer sidewalls of the sacrificial blank;
   encapsulating with an encapsulant at least a portion of the semiconductor die and the RF sub-assembly;
   separating the carrier substrate from a first major side of the encapsulated semiconductor die and RF sub-assembly to expose a second side of the sacrificial blank;
   etching the sacrificial blank to form a cavity in the RF sub-assembly, the conductive radiant element and the conductive shield exposed through the cavity; and
   affixing a package lid on the first major side of the encapsulated semiconductor die and RF sub-assembly, the package lid configured to serve as a signal reflector for propagation of an RF signal.

11. The method of claim 10, wherein the conductive radiant element and the conductive shield are formed by way of a same metallization process step.

12. The method of claim 10, wherein the patterned dielectric material is configured and arranged to electrically isolate the conductive radiant element from the conductive shield.

13. The method of claim 10, wherein the package lid is affixed to the second major side of the encapsulated semiconductor die and RF sub-assembly by way of a conductive adhesive material.

14. The method of claim 10, further comprising forming a package substrate on a second major side of the encapsulated semiconductor die and RF sub-assembly, the package substrate including a conductive trace interconnecting a bond pad of the semiconductor die and the conductive radiant element.

15. The method of claim 14, further comprising affixing conductive connectors to a bottom side of the package substrate, the conductive connectors configured and arranged to provide conductive connections between the semiconductor device and a printed circuit board (PCB) wherein the PCB includes a through opening vertically aligned with the cavity.

16. A method of manufacturing a semiconductor device, the method comprising:
   placing a semiconductor die on a carrier substrate;
   placing a radio frequency (RF) sub-assembly on the carrier substrate, the RF sub-assembly comprising:
      a sacrificial blank;
      a patterned dielectric material formed on a first side of the sacrificial blank;
      a conductive radiant element formed on the first side of the sacrificial blank; and
      a conductive shield formed at least on outer sidewalls of the sacrificial blank, the patterned dielectric material configured to electrically isolate the conductive radiant element from the conductive shield;
   encapsulating with an encapsulant at least a portion of the semiconductor die and the RF sub-assembly;
   separating the carrier substrate from a first major side of the encapsulated semiconductor die and RF sub-assembly to expose a second side of the sacrificial blank;
   etching the sacrificial blank to form a cavity in the RF sub-assembly, the conductive radiant element and the conductive shield exposed through the cavity; and
   affixing a package lid on the first major side of the encapsulated semiconductor die and RF sub-assembly, the package lid enclosing the cavity.

17. The method of claim 16, wherein the package lid is configured to serve as a signal reflector for propagation of an RF signal transmitted or received by way of the conductive radiant element.

18. The method of claim 16, wherein the portion of the package lid enclosing the cavity is substantially parallel to a bottom surface of the cavity and spaced a predetermined distance from the conductive radiant element at the bottom surface of the cavity.

19. The method of claim 16, further comprising forming a package substrate on a second major side of the encapsulated semiconductor die and RF sub-assembly, the package substrate including a conductive trace interconnecting a bond pad of the semiconductor die and the conductive radiant element.

20. The method of claim 19, wherein the semiconductor device is configured for propagation of the RF signal through an opening in an attached printed circuit board (PCB), the opening vertically aligned with the cavity.

* * * * *